United States Patent [19]

Rallapalli et al.

[11] Patent Number: 4,542,413

[45] Date of Patent: Sep. 17, 1985

[54] FACSIMILE DEVICE FOR RUN LENGTH CODING

[75] Inventors: Krishna Rallapalli, San Jose; Shinkyo Kaku, Los Gatos, both of Calif.

[73] Assignee: Advanced Micro Devices, Inc., Sunnyvale, Calif.

[21] Appl. No.: 524,817

[22] Filed: Aug. 19, 1983

[51] Int. Cl.⁴ .............................................. H04N 7/12
[52] U.S. Cl. ............................ 358/261; 340/347 DD
[58] Field of Search .............................. 358/260, 261; 340/347 DD

[56] References Cited

U.S. PATENT DOCUMENTS

| | | | |
|---|---|---|---|
| 3,783,187 | 1/1974 | Kusama et al. | 358/261 |
| 4,135,214 | 1/1979 | Weber | 358/261 |
| 4,167,758 | 9/1979 | Rothgordt | 358/261 |
| 4,185,303 | 1/1980 | Mounts et al. | 358/261 |
| 4,316,222 | 2/1982 | Subramamiam | 358/261 |

Primary Examiner—Michael A. Masinick
Assistant Examiner—Edward L. Coles
Attorney, Agent, or Firm—Patrick T. King; Gary T. Aka

[57] ABSTRACT

A high speed facsimile device suitable for integration using present day VLSI technology, for encoding binarily digitized picture information into run length codes. The device receives consecutive blocks of digitized picture data. In the device a run length generator unit, which is responsive to these consecutive blocks of picture data, generates the run lengths of color units in a data block. A combining unit coupled to the run length generator unit combines the run lengths of color units in more than one data block and an encoding unit coupled to the run length generator block and the combining unit generates in a pre-determined code, such as the recommended CCITT T.4 standard, the coded run lengths of color units independent of the data blocks.

16 Claims, 15 Drawing Figures

ROM 1 TABLE

| INPUT | | | OUTPUT | | | | | | |
|---|---|---|---|---|---|---|---|---|---|
| $B_0$ | $B_1$ | $B_2$ | $G_1$ | $G_2$ | $G_3$ | $G_4$ | $G_5$ | $G_6$ | $G_7$ |
| 0 | 0 | 0 | 1 | 1 | 1 | 1 | 1 | 1 | 1 |
| 1 | 0 | 0 | 0 | 1 | 1 | 1 | 1 | 1 | 1 |
| 0 | 1 | 0 | 0 | 0 | 1 | 1 | 1 | 1 | 1 |
| 1 | 1 | 0 | 0 | 0 | 0 | 1 | 1 | 1 | 1 |
| 0 | 0 | 1 | 0 | 0 | 0 | 0 | 1 | 1 | 1 |
| 1 | 0 | 1 | 0 | 0 | 0 | 0 | 0 | 1 | 1 |
| 0 | 1 | 1 | 0 | 0 | 0 | 0 | 0 | 0 | 1 |
| 1 | 1 | 1 | 0 | 0 | 0 | 0 | 0 | 0 | 0 |

FIG._7

ROM 2 TABLE

| INPUT | | | | | | | | OUTPUT | | | |
|---|---|---|---|---|---|---|---|---|---|---|---|
| $A_0$ | $A_1$ | $A_2$ | $A_3$ | $A_4$ | $A_5$ | $A_6$ | $A_7$ | $Q_0$ | $Q_1$ | $Q_2$ | $Q_3$ |
| 0 | 0 | 0 | 0 | 0 | 0 | 0 | 0 | 0 | 0 | 0 | 1 |
| 1 | 1 | 1 | 1 | 1 | 1 | 1 | 1 | 0 | 0 | 0 | 0 |
| 0 | 1 | 1 | 1 | 1 | 1 | 1 | 1 | 1 | 0 | 0 | 0 |
| 0 | 0 | 1 | 1 | 1 | 1 | 1 | 1 | 0 | 1 | 0 | 0 |
| 0 | 0 | 0 | 1 | 1 | 1 | 1 | 1 | 1 | 1 | 0 | 0 |
| 0 | 0 | 0 | 0 | 1 | 1 | 1 | 1 | 0 | 0 | 1 | 0 |
| 0 | 0 | 0 | 0 | 0 | 1 | 1 | 1 | 1 | 0 | 1 | 0 |
| 0 | 0 | 0 | 0 | 0 | 0 | 1 | 1 | 0 | 1 | 1 | 0 |
| 0 | 0 | 0 | 0 | 0 | 0 | 0 | 1 | 1 | 1 | 1 | 0 |

FACSIMILE DEVICE FOR RUN LENGTH CODING

This invention relates to facsimile devices and, more particularly, to electronic devices for encoding binarily digitized picture information into a run length code.

BACKGROUND OF THE INVENTION

Facsimile is a system by which picture information, especially that of documents, is scanned, electrically transmitted, received, and reproduced at a distant point. In a digital facsimile system a page of a document is divided into a grid of small areas or picture elements. Depending upon the "color" of a picture element, i.e., whether the area is dark or not, a picture element is digitized to an electrical information bit of "one" or "zero". If each area is small enough, the resolution of the grid is fine enough to permit picture and documentary information to be transmitted adequately. One international standard divides a document of A4 size, a sheet 210 millimeters wide by 297 millimeters long, into picture element density of 8 elements per millimeter horizontally (or 1,728 across the sheet) and 3.85 elements per millimeter in the vertical direction.

The facsimile system scans the document with electro-optical devices line by line to generate the electrical data for transmission. However, the amount of data generated from one page in a document is very large. For example, for a sheet of A4 size and the resolution given above, approximately 2 million bits of information are required to be transmitted and received. Transmission times will be long and costs correspondingly high.

Therefore, different methods of transmitting information have been sought for more efficient and faster transmission of facsimile information. One such approach is run length coding. In run length coding each scan line of information is broken into color units, which are the units of contiguous picture elements of one color. In this method the length of the color unit, i.e., the number of picture elements, either white or black, is encoded and transmitted. From empirical data, the frequency of occurrence of particular run lengths and their colors may be determined. For example, generally the white or blank run lengths are more likely to occur in a document than the black color units, which are likely part of writing in the document. By this frequency determination a code can be created so that those color units occurring with the most frequency have the shortest code while those occurring with the least frequency have the longest code. This enables the facsimile data to be transmitted with the maximum efficiency which increase speed and lower cost.

One run length code is the modified Huffman code, which is part of an international standard recommendation CCITT T.4. Generally this coding can compress the digital information of a typical document into one-fifth to one-eighth the original data volume. For an explanation of digital coding standards, see "International Digital Facsimile Coding Standards," by R. Hunter and A. H. Robinson in the *Proceedings of the IEEE*, Volume 68, No. 7, July 1980, pages 854–867 and which is incorporated by reference herein. The international standard recommendation also presents a two-dimensional coding procedure which includes the run length coding mentioned above. The present inventors have also invented a coding method and device based on the CCITT T.4 recommendation. Reference is made to the patent application, U.S. Ser. No. 524,818, filed of even date by the applicants, entitled "*METHOD AND DEVICE FOR TWO-DIMENSIONAL FACSIMILE CODING.*"

The development of solid state scanning devices has also increased scanning speeds so that scanning times of a few milliseconds to fractions of a millisecond per picture element information are possible. Thus the most recent facsimile devices process a document with a high speed electro-optical scanner line by line and store the generated digitized data into a line memory. These data are then coded and compressed for efficient transmission.

Heretofore, facsimile devices generally load the data from the line memory serially and encode, or compress, the data serially. Even devices which load the line memory data in parallel perform the compression serially by sequentially counting the run lengths of color units bit by bit. This approach is a bottleneck to high-speed run length coding.

On the other hand, the present invention is a device by which the picture data is loaded from the line memory in parallel and encoded in parallel. This considerably speeds the time for generating the compressed code words over that of the prior art without an increase in clock speed. The present invention is a faster and more economical way of encoding run length data.

The prior art requires changing the scanned data from the line memory into serial data. With a separate clock signal the run length of scanned data in each color unit in the scanned data is counted. For example, assuming 1,728 bits per scan line, at least 1,728 clock signals are required to determine the run lengths of the color units in one scan line.

In contrast, the present invention does not require the scanned data to be converted into serial data. Rather, the scanned data is loaded in parallel from the line memory into an input register and encoded in parallel into the run lengths of each color unit. The number of clock cycles to compress the data depends upon the number of color units in the data, not the number of picture element signals in the data. In a line of one color unit only, white or black, it is possible to determine the run length of the data in one cycle in principle. Actually the number of clock cycles required also depends upon the number of bits to be processed at a time. Assuming that number of bits to be 8, a line of a single color unit may be processed in 216 (1,728 divided by 8) clock cycles.

In a typical scan line having, say, an average of 3 color units per 8 bits of data, the present invention compresses the data in 648 (3 times 1,728/8) clock cycles. This is far better than 1,728 cycles required by prior art designs. In actual practice, the advantage in efficiency is better, since most documents have less than 3 color units within 8 picture elements.

Since the present invention can process the data much faster than prior art devices, without an increase in the clock cycle time, it is much more suitable for modern LSI (large scale integration) technology. The implementation of a facsimile device in highly integrated semiconductor products lowers the cost of the facsimile device and generally increases the reliability of the device. Thus this invention has many advantages over the prior art.

SUMMARY OF THE INVENTION

The present invention achieves these results by providing for a facsimile device for encoding the run lengths of color units in lines of digitized picture data, the facsimile device having a means responsive to consecutive blocks of the picture data in parallel for generating the run lengths of color units in a data block, a combining means responsive to the generating means for generating the run lengths of color units in more than one data block, and a first encoding means responsive to the generating means and the combining means for generating in a predetermined code the run lengths of color units independent of the blocks.

The combining means generates the run length of a color unit in more than one data block by summing the run lengths of the portions of the color unit in consecutive data blocks.

Another aspect of the present invention is a facsimile device for encoding the run lengths of color units in lines of picture elements, each picture element digitized into binary signals, and the device having control logic that generate control signals. The device has a first register responsive to the control signals for receiving and holding in parallel consecutive blocks of the picture element signals, and a means responsive to the control signals and coupled to the first register, for sequentially generating signals representing the run length of each color unit in a signal block. The device also has a first adding means coupled to the signal generating means and a second register means coupled to the adding means for holding signals therefrom and for passing signals thereto. The second register means operates with the first adding means to sum the run length of the last color unit in a first signal block and run length of the first color unit in the next consecutive signal block conditional upon the color of the last and first color units being the same, responsive to the control signals. Finally, the device has a first encoding means responsive to the control signals and coupled to the second register means for coding the run lengths of the color units in a predetermined code from the second register means run length signals, whereby the run lengths of the color units are encoded independent of the signal blocks.

SHORT DESCRIPTION OF THE DRAWINGS

A better understanding of the invention may be achieved by reference to the following drawings and the detailed description below.

DETAILED DESCRIPTION OF EMBODIMENTS OF THE INVENTION

Figures 1, 15:
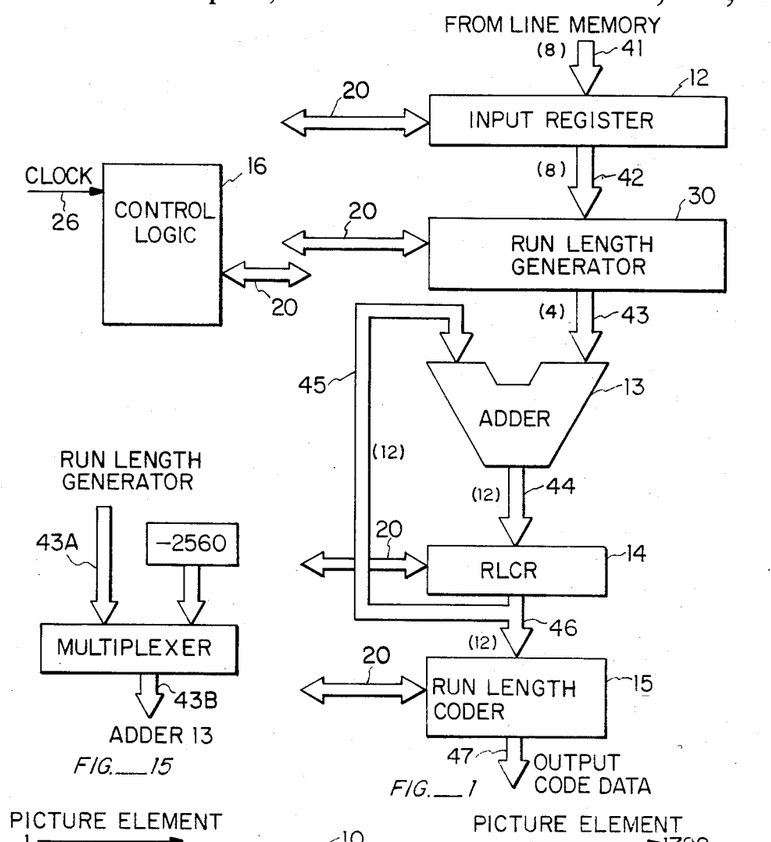
FIG. 1 illustrates the overall architecture of the present invention.
FIG. 15 is a diagram for additional circuitry to the elements of FIG. 1 for the encoding of very long run lengths of color units.

FIG. 1 shows the overall architecture of the present invention in which the digitized picture information is received from the line memory (not shown). In this figure and other drawings herein, numbers in parentheses are placed in close proximity to various signal paths. These numbers indicate the "width", or the number of bits of information carried in parallel by the signal path.

Figure 2:
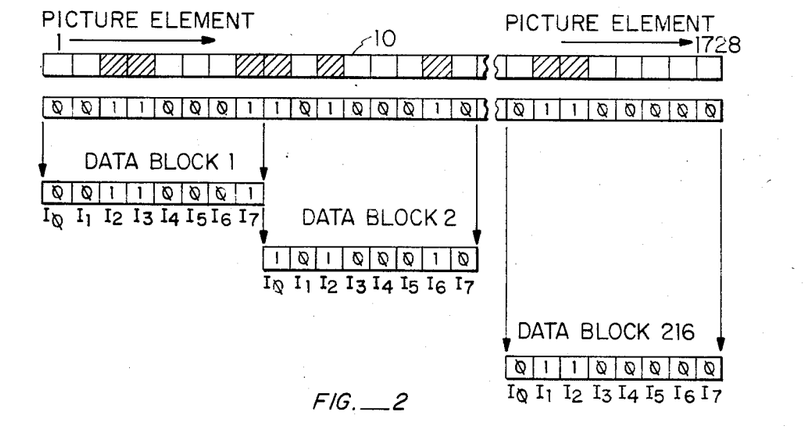
FIG. 2 graphically illustrates the picture elements of a scan line and the corresponding digitized signals. The figure also shows how the digital data are introduced as input data into the present invention.

FIG. 2 illustrates the source of data in the line memory by a representative line of picture information from picture element 1 on the left as a start point to the last picture element 1,728 on the right as an end point. The picture information is scanned and digitized into data of ZEROS and ONES with a ZERO representing a white picture element and a ONE representing a black picture element.

The first 8 digitized data are parts of a data block 1, the following 8 form the data block 2 and so on. The last 8 form block 216. As can be seen, this exemplary line of picture data is formed by an alternating sequence of white and black color units, with the first color unit being white and two units long, the second being black and two units long, the third white and three, the fourth black and two, the fifth white and one, the sixth black and one, the seventh white and four and so on. It should be noticed that the fourth color unit, black and two, is split by the data blocks 1 and 2 so that this color unit is divided into the last color unit in data block 1 of run length 1 and the first color unit in data block 2 of run length 1.

The next line below of picture information is similarly scanned and digitized and loaded into the line memory for processing and transmission. This continues line by line until the last color unit of the last line to complete a page of the document.

The present invention processes the digitized data as the data blocks scan the line memory are into an input register 12 in FIG. 1. The data blocks are sequentially moved via an 8-bit wide data path 42 into a run length generator element 30 which, for a given data block, generates sequentially the run length in binary of each color unit in that data block. The run length signals of each color unit are received by one set of input terminals of an adder 13 which is connected to a run length code register (RLCR) 14, which stores the result of the operation of the adder 13.

In normal operation the adder 13 passes the run length signals of a color unit in a data block for storage in the run length code register 14. The run length signals are then released from the register 14 through the data path 46 to the run length coder 15 which sends a specific code word for a particular run length and color as output.

However, if the color unit is the last color unit in a data block, the register 14 does not immediately release its contents to the coder 15. The next data block from the input register 15 is loaded into the run length generator 30. If the run length of the first color unit in the next data block is determined to have the same color as the last color unit in the preceding data block, the two color units are actually one color unit extending between the two data blocks. The run length signals of the last color unit is sent back to a second set of input terminals of the adder 13 along a path 45; the run length signals of the first color unit of the next data block appears at the first set of input terminals of the adder 13 by the path 43. The results of the addition are then placed into the run length code register 14. For example, for data blocks 1 and 2 in FIG. 2, the adder 13 adds "1" and "1" to get "2" for the run length of the fourth color unit.

If the first color unit of the next data block extends across the entire data block, then the summed results will be sent back along the data path 45 into the adder 13 if it is found that the third data block has its first color unit as the same color as the previous two color units. This will continue until one of the data blocks has a second color unit, i.e., the multiblock color unit is at an end. At this point the run length coder 15 is enabled and the contents of the run length code register 14 is coded and released as output data.

Operation of the elements in FIG. 1 and timing of these operations are performed by a control logic unit 16. The control logic 16 communicates with the elements by generalized control lines 20 and receives clock signals on a line 26 for timing. In the specific circuits below these control lines are explained and individually numbered. The control logic 16 is implemented as a programmable logic array (PLA) or read only memory (ROM) and may be set by one skilled in the art in accordance with the detailed explanations below. As there are more than one embodiment of the invention requiring somewhat differing controls, the different control logic are distinguished by alphabetical suffixes to the reference numeral 16.

Figure 3:
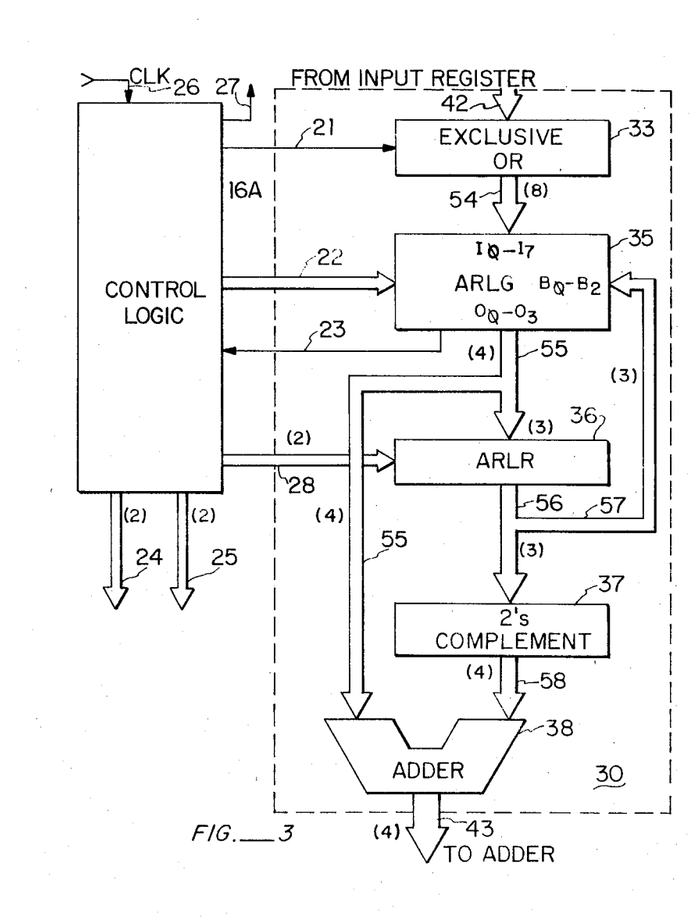
FIG. 3 shows the structure of one embodiment of the run length generator element shown in FIG. 1.
Figure 4:
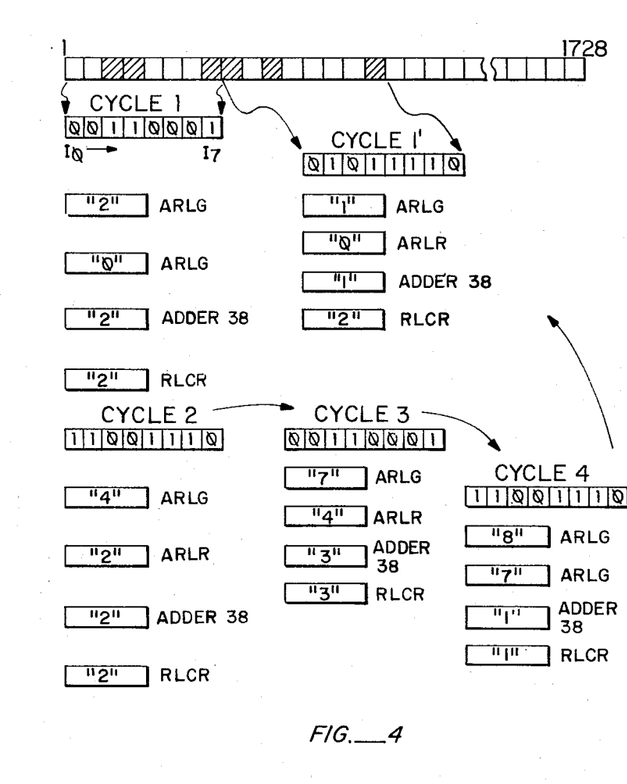
FIG. 4 illustrates the operation of the run length generator element in FIG. 3.

FIG. 3 is a detailed diagram of the elements of one version of the run length generator element 30 of FIG. 1. FIG. 4 shows the operation of the elements of FIG. 3. The run length generator 30 has an EXCLUSIVE OR circuit 33 which receives in parallel the contents from the input register 12 on an 8-bit parallel path 42. Responsive to the signal on the control line 21 from the control logic 16A, the EXCLUSIVE OR block 33 either passes the signals from the input register 12 unchanged or inverts them. This data is received by an accumulated run length generator (ARLG) 35 to generate the accumulated run length of each color unit in the data block. The accumulated run length is the sum of the run length of a particular color unit and all other preceding color units in that data block.

The accumulated run length generator 35 is connected to the input terminals of an accumulated run length register (ARLR) 36 and an adder 38. The output terminals of the accumulated run length register 36 are connected to the input terminals of a twos complement unit 37 by a 3-bit path 56, and to another set of input terminals of the generator 35 by a feedback path 57. Identical signals travel on path 56 and 57. The output terminals of the twos complement unit 37 are connected to a set of input terminals to the adder 38 by path 58.

Control and timing by the control logic 16A over the run length generator element 30 is accomplished by the color flag control line 21, another single control line 23, and double control lines 22, 28. The control signal on the line 21 alternates between a "1" and "0" at each clock cycle to provide the invert/pass function on the data in the input register 12 by the EXCLUSIVE OR unit 33. The control signal on the line 23 from the generator 35 informs the control logic 16A when the last color unit in a data block is being processed. The double control lines 22 control the timing and operation of the generator 35. Similarly, the load and clear functions of the register 36 are controlled by the signals on the double lines 28. The control logic 16A also has double control lines 25 to clear and enable the run length code register 14 and double control lines 24 to the coder 15. One of the lines 24 tells the coder 15 whether the run length signals at its input terminals are white or black; the other control line enables the coder 15 to perform its function.

Signals on the control line 27 to the input register 12 enable the register 12 to load data signals from the line memory.

The operation of the run length generator 30 in FIG. 3 is illustrated in FIG. 4. In FIG. 4 an example is used in which the run length of each of the color units in the first data block are generated in 4 clock cycles. Since the first data block in a line is to be processed, the accumulated run length register 36 in FIG. 3 and the run length code register 14 in FIG. 1 are cleared and set to "0" by signals on control lines 28 and 25 respectively. Thereafter the register 36 is cleared after each color unit in a data block and the register 14 after each color unit in the data line. The two clear signals are normally coincident; however, this is not the case at the end of one data block and the beginning of the next block. The register 14 must hold its data until after the next data block is loaded into the input register 12 and the color of the first color unit in the block determined.

For the start point of each line of digitized data, the control logic 16A and other control assumes that the first color unit is white. Therefore, the color flag signal on control line 21 starts with ZERO and thereafter alternates for each color unit and clock cycle. If the first color unit in the first data block is black, then a "0" run length is coded and transmitted as the run length at the first color unit.

In cycle 1 in the example, after the first data block is loaded into the input register 12, the EXCLUSIVE OR circuit 33 by the color flag signal on line 21 passes the digitized picture element signals unchanged to the accumulated run length generator 35. The accumulated run length generator 35 generates output signals of "2" in binary because the first color unit is indeed white. The signals pass to the accumulated run length register 36. Since this is at the beginning of the data block, the accumulated run length register 36 has been cleared and is zero.

The adder 38 operates to subtract the accumulated run length of the previous color unit from the run length of the following color unit in a data block. In this manner the run length of the following color unit is obtained. Thus the operation of the adder 38 upon the output signals of the accumulated run length generator 35 and the twos complement unit 37 receiving the contents of the register 36, "0" in cycle 1, results in the decimal value of "2." The element 30 has generated the run length of the first color unit in the first block.

In cycle 2 the color flag signal on the line 21 alternates to a ONE and the EXCLUSIVE OR circuit 33 inverts the contents of the input register. The accumulated run length generator 35 generates a value of "4", which is the accumulated run length of the second color unit in the data block. The accumulated run length register 36 holds the value of "2" from cycle 1, which signals are operated on by the twos complement circuit 37. The adder 38 thus subtracts "2" from "4," to obtain the value "2". The run length code register 14 sends this value on to the run length coder 15.

Cycle 3 has the accumulated run length of "7" generated by the unit 35, while the accumulated run length register 36 holds the accumulated run length of the previous cycle 2. The adder 38 generates the difference between these two numbers, i.e., "7" minus "4" or "3". This value "3" goes to the run length register 14 for coding.

In cycle 4 the value "8" is generated by the accumulated run length register 35. The accumulated run length register 36 contains the value of "7" from cycle 3 and therefore the adder 38 ("8" minus "7") generates a value of "1". The run length code register 14, which for previous cycles 1-3 had released the signals to the coder 15, stores this value of "1".

The control logic 16A determines that cycle 4 contains the last color unit in the data block by the control line 23, which is simply the highest order output line $0_3$ of the generator 35. When the value "8" is reached $0_3$ must be ONE. In that case the control logic 16A does not clear the register 14 as was done in the previous cycles nor does it enable the decoder 15.

Instead the control logic 16A sends a control signal on the line 27 to the input register 12 and the next data block is then loaded into the input register 12 to begin the process of generating the run lengths of color units in this block all over again. The color flag signal on the line 21 is not alternated this time. In FIG. 4 the first cycle for the first color unit in the second data block is denoted as cycle 1'. The accumulated run length register 35 generates a value of "1", while the accumulated run length register 36 has been reset to the value of "0." The adder 38 generates a difference of "1." However, this first color unit has the same color, i.e., black, as the last color unit of the previous data block. Therefore, the two run lengths are summed by the adder 14, the "1" for cycle 1' on input path 43 and the "1" for cycle 4 on feedback path 45, and the results, "2", loaded into the run length code register 14 before being sent to the coder 15. If this first color unit had been white, a value of "0" would have been generated to add the value in the register 35 for loading into the register 14.

Thus the block 30 generates the run lengths of color units in each of these data blocks.

A flow chart of the operation of the overall system diagrammed in FIG. 1 with the run length generator 30 discussed above is detailed in FIG. 5.

Figure 6:
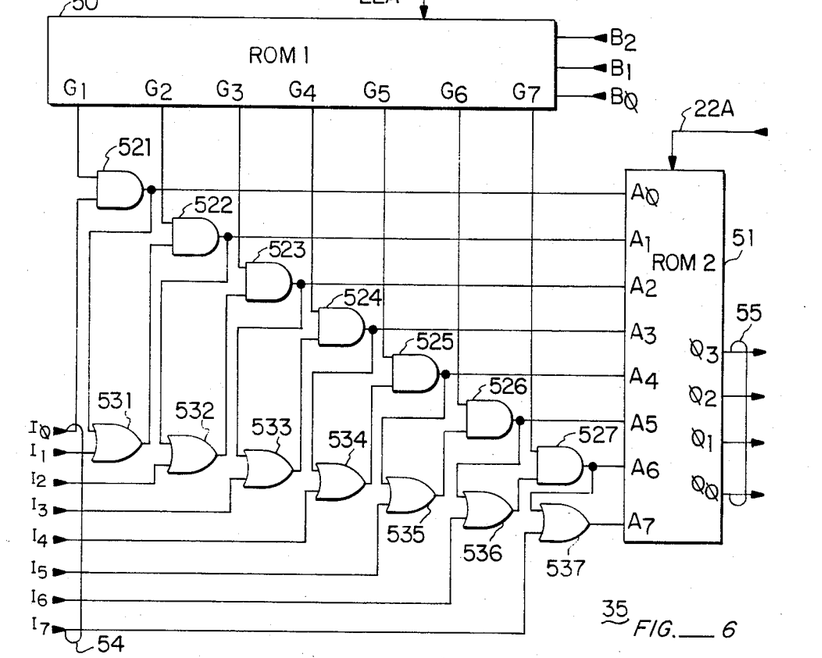
FIG. 6 is the detailed circuit of the accumulated run length generator unit shown in FIG. 3.

In FIG. 6 there is shown a circuit implementation of the accumulated run length generator 35. This circuit has two ROMS 50, 51 which are interconnected by OR gates 531-537 and AND gates 521-527. The ROMs 50, 51 are enabled by a signal on the control line 22A. The circuit receives input signals, denoted as $I_\phi$-$I_7$ from the EXCLUSIVE OR element 33.

Figure 7:
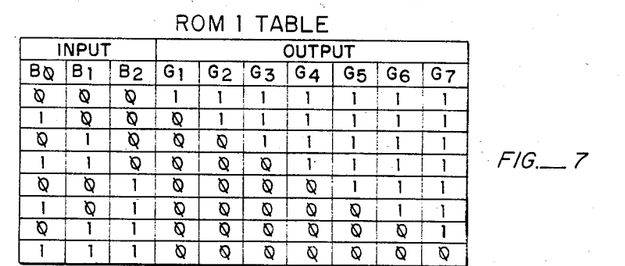
FIGS. 7 and 8 show the input-output tables for the two ROMS in FIG. 6.

The ROM 50 receives as input the $B_\phi$-$B_2$ signals on the feedback path 57 shown in FIG. 3. The signals correspond to the accumulated run length of the previous color unit, which is stored in the accumulated run length register 36. The ROM 50, set in accordance with the input-output table in FIG. 7 and responsive to these input signals $B_{100}$-$B_2$, generates signals which form a mask for the input signals $I_\phi$-$I_7$.

When the register 36 is empty, i.e., "0", the output signals $G_1$-$G_7$ of the ROM 50 enables all of the AND gates 521-527 to be able to generate a "1" output signal. A ONE input signal on an input terminal will generate a ONE output signal on that order output terminal and higher. For example, if $I_3$ is "1," then $A_3$-$A_7$ are "1." When the register 36 contains a number, say, 3, the output signals that $A_\phi$-$A_2$ signals are ZERO. The lowest order appearing ONE from the ROM 50 ensures that remaining output signals $I_3$-$I_7$ will cause a "1" signal on that order output and higher.

For cycle 1 of the example in FIG. 4, each of the AND gates 521-527 has at least one input terminal with a "1" signal from the ROM 50. The input signals $I_\phi$-$I_7$, "00110001," cause the output signals of the OR gates 531-537 and the AND gates 521-527 to be "0011111". The output signals $A_\phi$-$A_7$ are thus "00111111" and "0011111" respectively.

Figure 8:
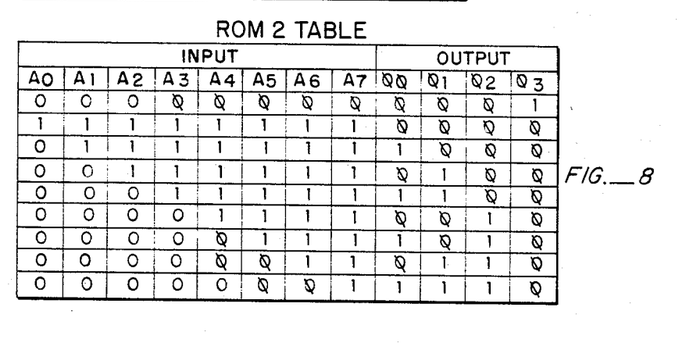

The signals $A_\phi$-$A_7$ are received by the ROM 51. As illustrated by the input-output table in FIG. 8, the ROM 51 is set so that the number of ZEROs in the input signals $A_\phi$-$A_7$ appear in binary on the output signals $O_\phi$-$O_3$. In the present example, $O_\phi$-$O_3$ equal "0010." $O_{100}$ is "0", O is "1", $O_2$ is "0" and $O_3$ is "0" in the reverse-ordered binary output table in FIG. 8.

In FIG. 4, cycle 2, the register 36 now contains the value of "2" or "0010" in binary. Since the path 57 carries the three lower order bits back to the generator 35, the ROM 50 receives "010" as input signals $B_\phi$-$B_2$. This combination of input signals, by reference to the FIG. 6 table, indicates that the first two output signals $G_1$, $G_2$ are "0," while the remaining output signals $G_3$-$G_7$ are "1." At the same time the EXCLUSIVE OR block 33 inverts all of the signals in the input register 12 so that the second color unit, originally black, appears as white or "0" signals on $I_2$ and $I_3$. Since input signal $I_4$ is a "1," all of the output signals for OR gates 534-537 are "1," while the output signals for OR gates 531-533 are "0."Therefore the output signals for the AND gates 521-524 are "0" and the remaining AND gates 525-527 are "1." The output signals $A_\phi$-$A_3$ are "0" and the signals $A_4$-$A_7$ are "1." FIG. 8 implies that the output signals $O_\phi$-$O_3$ are "0100", i.e., there are four zeros as inputs to the ROM 51. In this manner the circuit shown in FIG. 6 generates the accumulated run lengths of color units within a data block.

Figure 9:
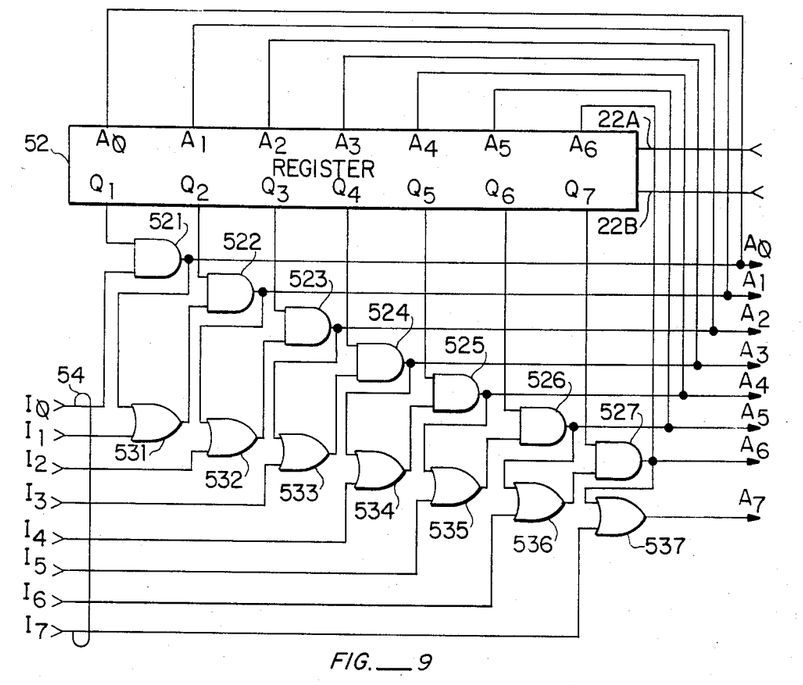
FIG. 9 shows an alternative circuit which may be used in the circuit shown in FIG. 6.

An alternative to some of the circuitry shown in FIG. 6 is illustrated in FIG. 9 in which the ROM 50 has been replaced by a register 52. The register 52 does not require feedback signals from the accumulated run length register 36. Instead, the register 52 takes its input signals directly from the AND gates 521-527. The input signals $A_\phi$-$A_6$ in one cycle into the register 52 appear as respective register 52 output signals $Q_1$-$Q_7$ in the next cycle. A signal on the control line 22A, enables the leading of the $A_\phi$-$A_7$ signals into the register 52 and the appearance as $Q_1$-$Q_7$ output signals of the previous $A_\phi$-$A_7$ signals. A signal on the line 22B clears the register 52.

Figure 10:
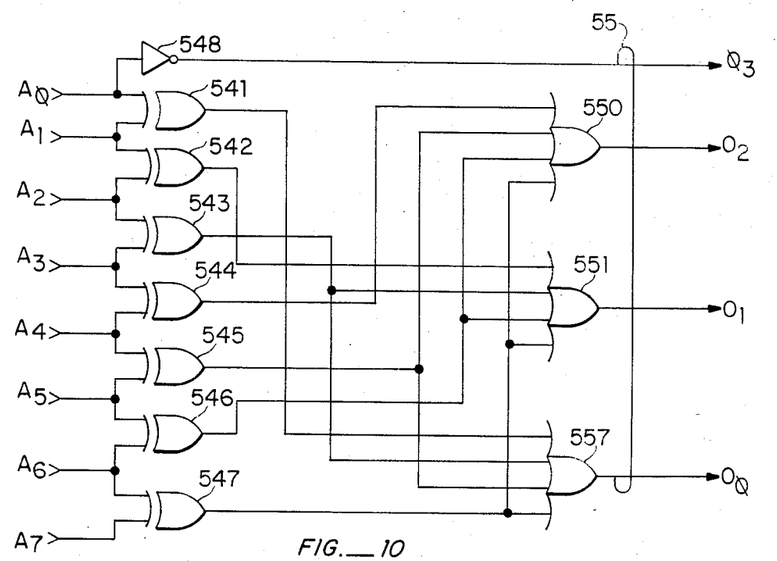
FIG. 10 is another alternative circuit which may be used in place of the second ROM shown in FIG. 6.

FIG. 10 shows a replacement for the ROM 51 in FIG. 6. The circuit in FIG. 10 uses combinatorial logic by the use of the EXCLUSIVE OR gates 541-547 and an inverter 548. The output terminals of the EXCLUSIVE OR gates 541-547 from the input terminals of the OR gates 550-552 which generate the output signals $O_\phi$-$O_3$. The $O_3$ output signal is generated by the inverter 548.

Figure 11:
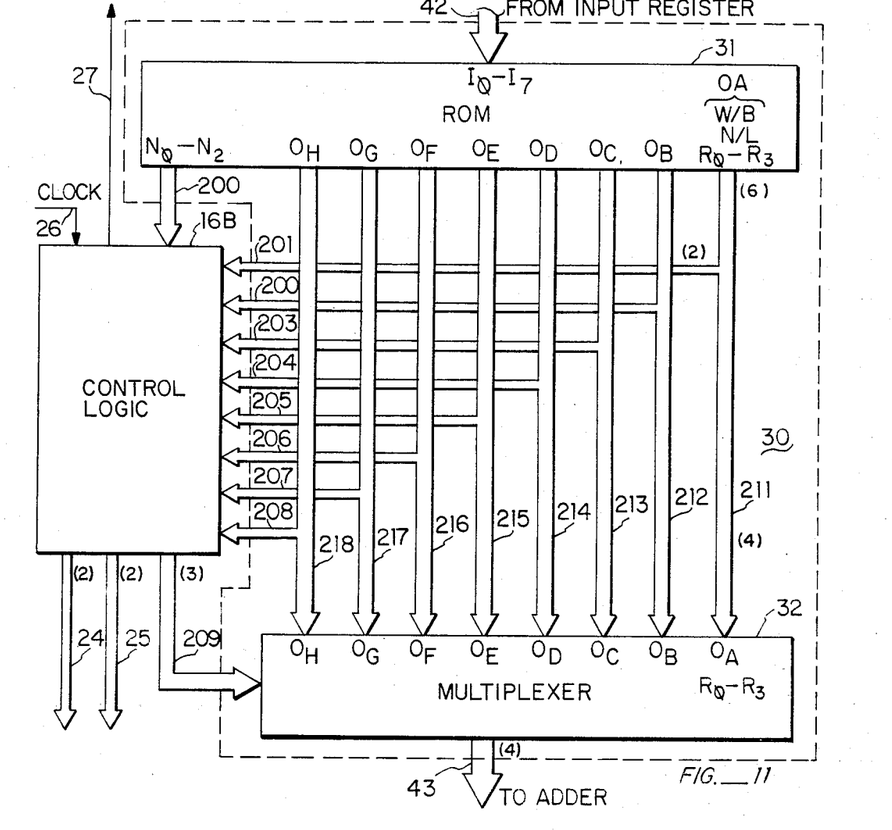
FIG. 11 illustrates an alternative embodiment of the run length generator element shown in FIG. 1.

Another embodiment of the run length generator element 30 of FIG. 1 is shown in FIG. 11. A ROM 31 receives the input signals $I_0$-$I_7$, the signals of a data block, from the input register 12. The ROM 31 simultaneously generates 51 signals. These signals are formed by 8 groups of 6 signals, here designated as OA-OH, and 3 control signals $N_0$-$N_2$, which travel to the control logic 16B along a path 200. Each group of signals OA-OH correspond to one of 8 possible color units in the data block represented by the signals $I_0$-$I_7$.

Figure 12:
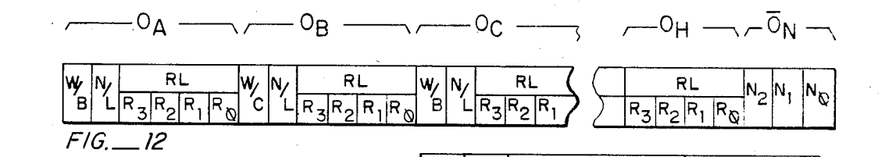
FIG. 12 shows the arrangement of output signals of the ROM shown in FIG. 11.

Each group of signals has 4 signals $R_0$-$R_3$ indicating the length of the particular color unit. A fifth signal W/B indicates whether the color unit is white or black and a sixth signal N/L which indicates whether the particular color unit is the last color unit in the data block. The control signals $N_0$-$N_2$ indicate to the control logic 16B the actual number of color units in a particular data block from the input register 12. FIG. 12 shows the configuration of the output signals of the ROM 31.

The control logic is designated by the suffix "B," since it must be configured differently from the control logic 16A discussed previously. However, the operation of the system disclosed in FIG. 1 still operates in the same way as indicated by the flow chart in FIG. 5, with the references to the accumulated run length generator (ARLG) 35 and the accumulated run length register (ARLR) 36 appropriately modified to accomodate the operations of this new embodiment of the run length generator 30. These accommodations will be evident by the description below.

From the ROM 31 the groups of output signals are divided so that the four run length signals $R_0$-$R_3$ of each color unit are sent to a multiplexer 32 while each of the indicator signals, W/B and N/L, is sent on data paths 201-208 to the control logic 16B. The control logic 16B at each clock cycle by the control signals on control lines 209 to the multiplexer 32 sequentially selects the run length signals of each of the color units to appear as output signals on the path 43 to the adder 13.

Figure 13:
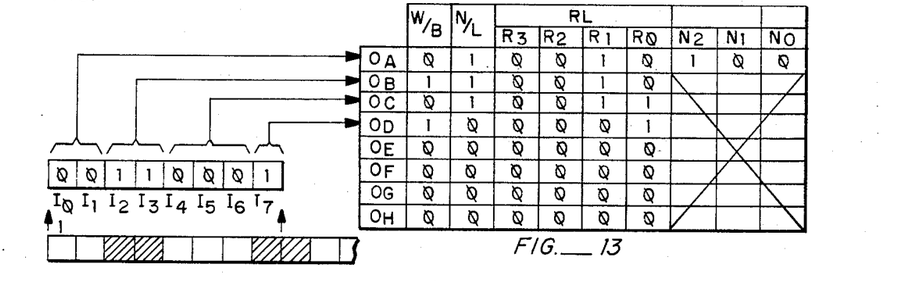
FIG. 13 illustrates the operation of the circuit in FIG. 11.

FIG. 13 illustrates the operation of the embodiment shown in FIG. 11. The number of color units in the example data block is four and therefore only the signal groups OA-OD are filled. Signals $N_0$-$N_2$ indicate "4" in binary. The signals in the OA group indicate that the run length of the first color unit is "2" in binary ("0010"), the color is white (W/B signal is "0"), and the color unit corresponding to the OA signals is not the last color unit appearing in the data block (N/L signal is "1"). The second and third color units generate similar signals for groups OB and OC.

The last color unit corresponding to group OD has a run length of "1" ("0001" in binary), a black color (W/B signal "1"), and the N/L signal equal to "0" representing that it is the last color unit in the data block. The ROM 31 also generates "100" on the control path 200 to indicate to the control logic 16B that four color units are in the data block.

The control logic 16B on each clock cycle on the line 26 sends control signals on the three-bit wide control path 209 to the multiplexer 32. Sequentially the run length signals $R_0$-$R_3$ of groups OA, OB, OC, OD are selected as output signals on the path 43 on each cycle.

Furthermore, the control logic 16B has the control lines 24 and 25. As discussed previously, the two control logic lines 24 carry control signals to enable and to inform the run length coder ROM 15 of the white/black status of the color unit to be coded. The two control lines 25 load and clear the run length code register 14. Thus the embodiment shown in FIG. 11 operates as a run length generator 30 in the same fashion as that shown in FIG. 3. However, one consideration of the embodiment in FIG. 11 is that a ROM is required for ROM 31 which must have a memory space of over 13K bits ($2^8$ addresses $\times$ 51-bit words).

Figure 14:
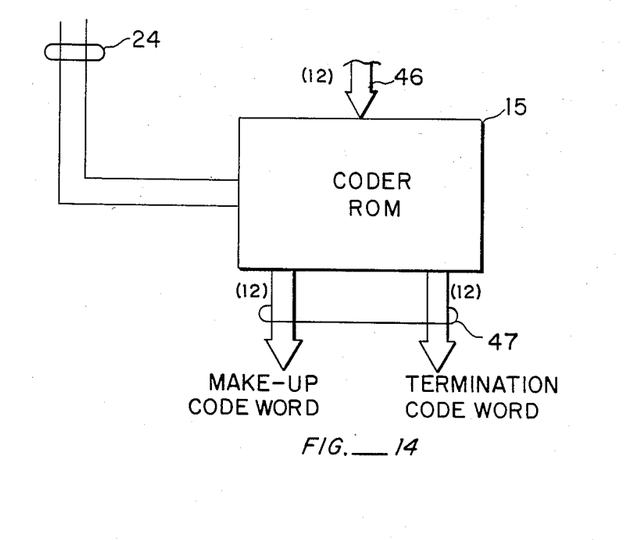
FIG. 14 is a diagram of the input and output lines of the run length coder element shown in FIG. 1.

FIG. 14 schematically represents the run length coder 15 of FIG. 1. The coder 15 is shown as a ROM but may also be a programmable logic array. The input signals to the ROM 15 are the run length signals of each color unit in a data line. These run length signals are held in the run length code register 14. The coder 15 also receives control signals on line 24 to enable the coder 15 and to determine what color a color unit is for coding purposes.

The configuration of the ROM 15 in FIG. 14 is for the modified Huffman code of the CCITT T.4 recommended standard discussed previously. For color units having run lengths of 0 to 63 picture elements a corresponding "terminating code word" is generated. For color units greater than or equal to 64, a "make-up code word" and a "terminating code" are generated. The make-up code word represents a run length in a multiple of 64, which is less than, or equal to, the actual run length of the color unit run length. The terminating code word carries the difference, including zeros, in run lengths.

Under the ordinary standard, the modified Huffman code provides make-up code words up to 1728 run lengths. For wider paper or higher resolution, the modified Huffman code has tables for make-up code words extended to 2560.

In the device described above, run lengths from 0 to 4095 are possible for coding by the ROM 15. This is possible since the run length code register 14 is 12 bits wide and the corresponding data paths 44, 45 and 46. With the modification described below, the invention is suitably adapted to handle such long run lengths.

The modification is such that for a run length greater than 2560 picture elements, the make-up code for 2560 is encoded. The the remaining run length is encoded by a pair of code words as described above. However, if the remaining run length is still greater than 2623 (2560 plus 63), then another make-up code for 2560 is encoded. This continues until the remaining run length is encoded by a make-up code word and terminating code word.

Figure 5:
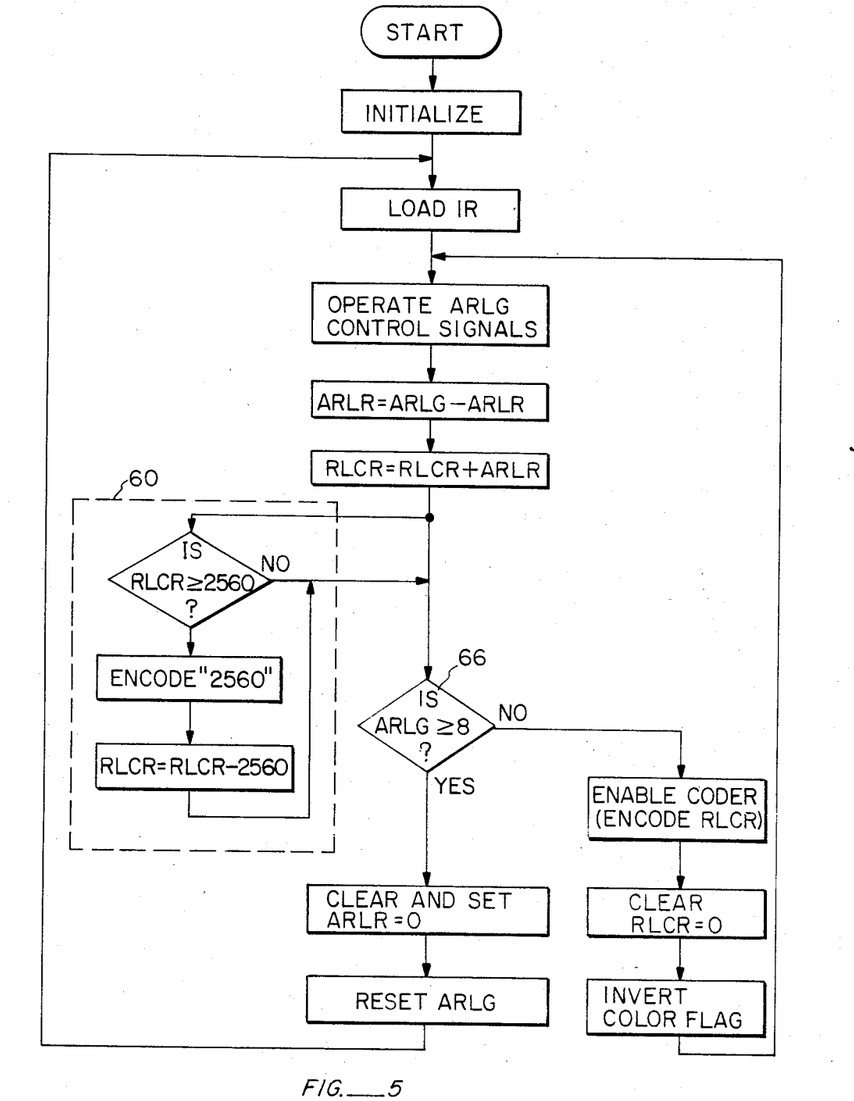
FIG. 5 is a flow chart of the operation of the present invention.

The additional operation steps are shown in FIG. 5. These steps are enclosed by a dotted line 61. The location of the extra steps is as indicated. To perform the "RLCR minus 2560" step more circuitry is required. These are shown in FIG. 15. As is evident from the drawings, these elements are inserted between the run length generator 30 and the adder 13. As shown in FIG. 12 the selected code is the modified Huffman code to comply with the international standards for run length coding.

Another modification may be to increase the data paths 44, 45, 46 in FIG. 1 from 12 bits to, say, 16 bits. The additional four bits provides for 16 times more information for a line of picture information. Thus higher resolution may be achieved and wider documents may be transmitted. Of course, the coder 15 and register 14 must be correspondingly increased.

Other possible changes to the device described above include making the input register 12 wider to be able to process more bits in data block. Such a change implies wider signal paths and increased circuitry for other parts of the device. However, considerations against making the input register 12 too wide include the additional circuitry to handle the increased number of bits and the decrease in the benefits obtained by the invention. If the input register is widened, then that many more color units will appear in the larger data block. This requires more cycles per data block to process the data.

Although the foregoing invention has been described with respect to particular embodiments, these embodiments are not intended to limit the invention, but rather to clarify and explain it. The scope of the invention is to be determined from the appended claims.

What is claimed is:

1. A facsimile device for encoding the run lengths of color units in lines of digitized picture data, said device comprising
   means responsive to consecutive blocks of said picture data in parallel for generating the run length of color units in a data block,
   combining means responsive to said generating means for generating the run lengths of color units in more than one data block, and
   first encoding means responsive to said generating means and said combining means for generating in a predetermined code the run lengths of color units independent of said blocks.

2. The facsimile device as in claim 1 wherein said combining means generates the run length of a color unit in more than one data block by summing the run lengths of the portions of said color unit in consecutive data blocks.

3. The facsimile device as in claim 1 wherein said combining means generates the run length of a color unit in at least two consecutive data blocks by summing the run length of the last color unit in the first block and the run length of the first color unit of the second block, conditioned upon the color of said last and first color units being the same.

4. The facsimile device as in claim 3 wherein said combining means comprises
   adding means coupled to said generating means, and
   means coupled to said adder for holding the run length of said last color unit in said first block,
   whereby said adder sums the run length of said last color unit from said holding means and the run length of said first color unit in said second block from said generating means upon the determination that the color of said last and first color units are the same.

5. The facsimile device as in claim 1 wherein said generating means comprises
   means for generating in parallel the run lengths of each color unit in a data block, and
   means coupled to said parallel generating means for sequentially selecting said run lengths of said color units.

6. The facsimile device as in claim 5 wherein said parallel encoding means comprises a ROM.

7. The facsimile device as in claim 1 wherein said generating means comprises
   means for sequentially generating the accumulated lengths of each color unit in a data block, and
   means coupled to said sequential generating means for determining the run length of each color unit from said accumulated run lengths.

8. A facsimile device for encoding the run lengths of color units in lines of picture elements; each picture element digitized into binary signals, said device generating control logic generating control signals comprising
   first register means responsive to said control signals for receiving and holding in parallel consecutive blocks of said picture element signals,
   means, responsive to said control signals and coupled to said first register means, for sequentially generating signals representing the run length of each color unit in a signal block,
   first adding means coupled to said signal generating means,
   second register means coupled to said adding means for holding signals therefrom and for passing signals thereto, said second register means operating with said first adding means to sum the run length of the last color unit in a first signal block and the run length of the first color unit in the next consecutive signal block conditional upon the color of said last and first color units are the same, responsive to said control signals, and
   a first encoding means, responsive to said control signals and coupled to said second register means, for encoding the run lengths of said color units in a predetermined code from said second register means run length signals,
   whereby the run lengths of said color units are encoded independent of said signal blocks.

9. The facsimile device as in claim 8 wherein said run length signal generating means comprises
   a ROM, coupled to said first register means, for generating in parallel the run lengths signals of each color unit in a signal block, and
   multiplexer means, responsive to control signals and coupled to said ROM, for sequentially selecting the run length signals said run length signals of said color units.

10. The facsimile device as in claim 8 wherein said run length signal generating means comprises
    means, responsive to said control signals and coupled to said first register means, for sequentially generating signals representing the accumulated run length of the color units in a block, and
    means, coupled to said accumulated run length signal generating means, for generating signals representing the run length of said color units corresponding to said accumulated run length signals.

11. The facsimile device as in claim 10 wherein said accumulated run length generating means comprises
    means, responsive to first signals indicative of the run length of a first color unit, for generating second signals indicative of said first color unit run length,
    logic means, coupled to said first register means and said second signals generating means, for generating signals indicative of the run length of the next consecutive color unit to said first color unit, and
    means, coupled to said logic means, for generating said accumulated run length signals of said next consecutive color unit.

12. The facsimile device as in claim 11 wherein said second signals indicative of said first color unit run length and said signals indicative of said next consecutive color unit run length are in the form of units of ONES and ZEROS, the number of ONES and ZEROS indicative of the accumulated run length of a color unit.

13. The facsimile device as in claim 12 wherein said second signals generating means comprises a register, responsive to said control signals and coupled to said logic means in such a manner that said register holds signals generated by said logic means for a color unit as input signals to said logic means to generate signals for the next consecutive color unit.

14. The facsimile device as in claim 12 wherein second signals generating means comprises a ROM, responsive to said control signals and to accumulated run length signals of a color unit, for generating said second signals for said logic means.

15. The facsimile device as in claim 10 wherein said run length signals generating means comprises
second adding means coupled to said accumulated run length signals generating means, and
third register means, responsive to said control signals and coupled to said adder and said accumulated run length signals generating means in such a manner that said third register means holds accumulated run length signals for a first color unit as input signals to said second adding means, said second adding means generating run length signals for the next consecutive color unit to said first color unit responsive to accumulated run length signals from accumulated run length signals generating means for said next consecutive color unit and accumulated run length signals from said third register means for said first color unit.

16. The facsimile device as in claim 15 further comprising means, coupled to said third register means, for generating the TWO's COMPLEMENT of said signals held by said third register means for said input signals to said second adding means.

* * * * *